(12) United States Patent
Sandner

(10) Patent No.: US 6,670,899 B1
(45) Date of Patent: Dec. 30, 2003

(54) INTERFACE CIRCUIT FOR MULTIPLEXING MULTIPLE SERIAL DATA STREAMS FROM UNSYNCHRONIZED CLOCK DOMAINS

(75) Inventor: Jered M. Sandner, Wellington, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 376 days.

(21) Appl. No.: 09/872,519

(22) Filed: Jun. 1, 2001

(51) Int. Cl.[7] .................................................. H03M 9/00
(52) U.S. Cl. ........................................ 341/100; 341/101
(58) Field of Search ................................. 341/100, 101; 370/537, 366; 710/71

(56) References Cited

U.S. PATENT DOCUMENTS

| | | | | |
|---|---|---|---|---|
| 4,728,930 A | * | 3/1988 | Grote et al. ................. | 341/101 |
| 5,005,151 A | * | 4/1991 | Kurkowski .................... | 710/36 |
| 5,144,305 A | * | 9/1992 | Gotz et al. .................... | 341/73 |
| 5,321,399 A | * | 6/1994 | Notani et al. ................ | 341/100 |

\* cited by examiner

*Primary Examiner*—Peguy JeanPierre

(57) ABSTRACT

A serial stream interface for combining a master serial data stream comprising a sequence of N-bit master data packets and a slave serial data stream comprising a sequence of N-bit slave data packets. The serial stream interface comprises: 1) a slave input interface comprising a slave buffer having a serial input for receiving the slave serial data stream and an N-bit slave parallel output for outputting each of the N-bit slave data packets wherein the slave buffer stores each N-bit slave data packet using at least one slave timing signal associated with the slave serial data stream; 2) a source selection circuit having a first input channel for receiving an N-bit master parallel output from a first master data source and a second input channel coupled to the N-bit slave parallel output; and 3) a serialization circuit having an input coupled to an output of the source selection circuit for receiving a selected one of the N-bit master parallel output and the N-bit slave parallel output and a serial output, wherein the serialization circuit sequentially shifts out each bit of the selected one of the N-bit master parallel output and the N-bit slave parallel output.

27 Claims, 2 Drawing Sheets

INTERFACE CIRCUIT FOR MULTIPLEXING MULTIPLE SERIAL DATA STREAMS FROM UNSYNCHRONIZED CLOCK DOMAINS

TECHNICAL FIELD OF THE INVENTION

The present invention is generally directed to digital signal processors and, in particular, to an interface circuit that multiplexes and synchronizes multiple serial data streams from unsynchronized clock domains.

BACKGROUND OF THE INVENTION

There are many applications in which it is necessary to combine unsynchronized data streams from different clock domains for subsequent processing by the same device. For example, in many communication devices (e.g., switches, routers, transceivers) a single digital signal processor (DSP) may be used to process multiple packet-based input serial data streams from unsynchronized clock domains. If the input streams are handled separately, the DSP incurs a delay whenever the DSP switches between domains and the input serial data stream in the new domain is not yet completely received. Conventional solutions to such problems often require synchronization of the clocks in the different clock domains.

Therefore, there is a need in the art for improved interface circuits for combining two or more input serial data streams from unsynchronized clock domains into a single contiguous output data stream. In particular, there is a need for an interface circuit that is capable of multiplexing together two or more input serial data streams without adding special timing synchronization circuitry.

SUMMARY OF THE INVENTION

To address the above-discussed deficiencies of the prior art, it is a primary object of the present invention to provide a serial stream interface for combining a master serial data stream comprising a sequence of N-bit master data packets and a slave serial data stream comprising a sequence of N-bit slave data packets. According to an advantageous embodiment of the present invention, the serial stream interface comprises: 1) a slave input interface comprising a slave buffer having a serial input for receiving the slave serial data stream and an N-bit slave parallel output for outputting each of the N-bit slave data packets, wherein the slave buffer stores the each N-bit slave data packet using at least one slave timing signal associated with the slave serial data stream; 2) a source selection circuit having a first input channel capable of receiving an N-bit master parallel output from a first master data source and a second input channel coupled to the N-bit slave parallel output; and 3) a serialization circuit having an input coupled to an output of the source selection circuit capable of receiving a selected one of the N-bit master parallel output and the N-bit slave parallel output and a serial output, wherein the serialization circuit sequentially shifts out each bit of the selected one of the N-bit master parallel output and the N-bit slave parallel output.

According to one embodiment of the present invention, each bit in each N-bit slave data packet stored in the slave buffer becomes available in the N-bit slave parallel output substantially concurrently with storage of each bit in the slave buffer.

According to another embodiment of the present invention, the slave buffer is a first-in, first-out (FIFO) device.

According to still another embodiment of the present invention, the slave buffer is a 1×N-bit random access memory (RAM).

According to yet another embodiment of the present invention, the slave input interface further comprises a slave control circuit capable of receiving the at least one slave timing signal and generating therefrom at least one storage control signal capable of storing the each of the N-bit slave data packets in the slave buffer.

According to a further embodiment of the present invention, the source selection circuit comprises a first multiplexer having an M-bit output.

According to a still further embodiment of the present invention, the serialization circuit comprises a second multiplexer having a first M-bit input channel coupled to the M-bit output of the first multiplexer.

According to a yet further embodiment of the present invention, the serialization circuit comprises a flip-flop circuit having an M-bit input coupled to an M-bit output of the second multiplexer, wherein the flip-flop latches M-bits of data received from the second multiplexer on an M-bit output of the flip-flop.

In one embodiment of the present invention, the second multiplexer further comprises a second M-bit input channel coupled to the M-bit output of the flip-flop.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
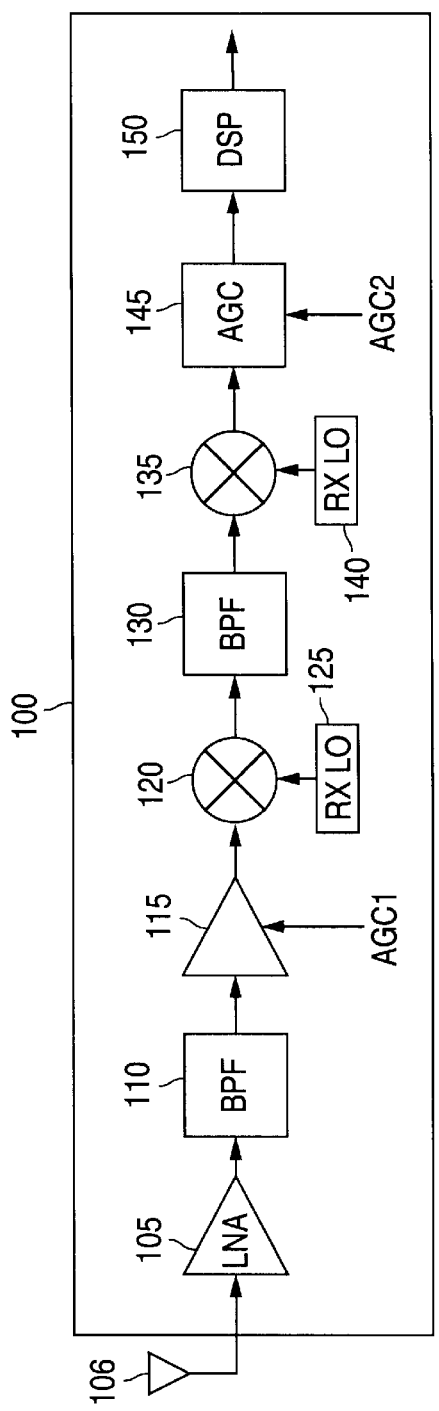
FIG. 1 illustrates selected portions of the receive signal path of an exemplary radio frequency (RF) transceiver according to one embodiment of the present invention.
Figure 2:
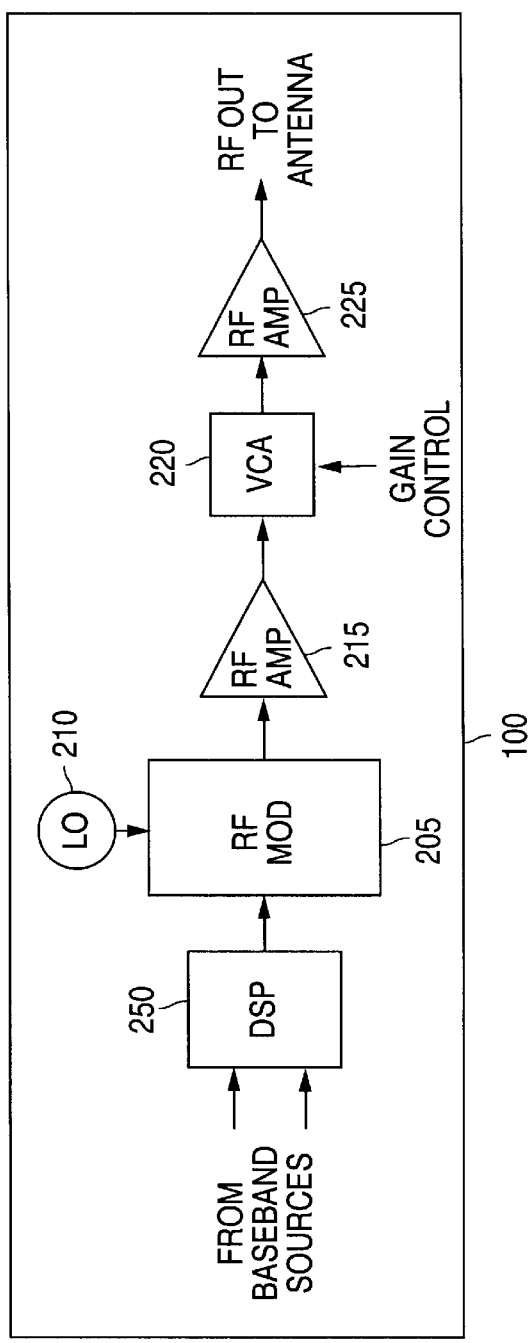
FIG. 2 illustrates selected portions of the transmit signal path of an exemplary RF transceiver according to one embodiment of the present invention.
Figure 3:
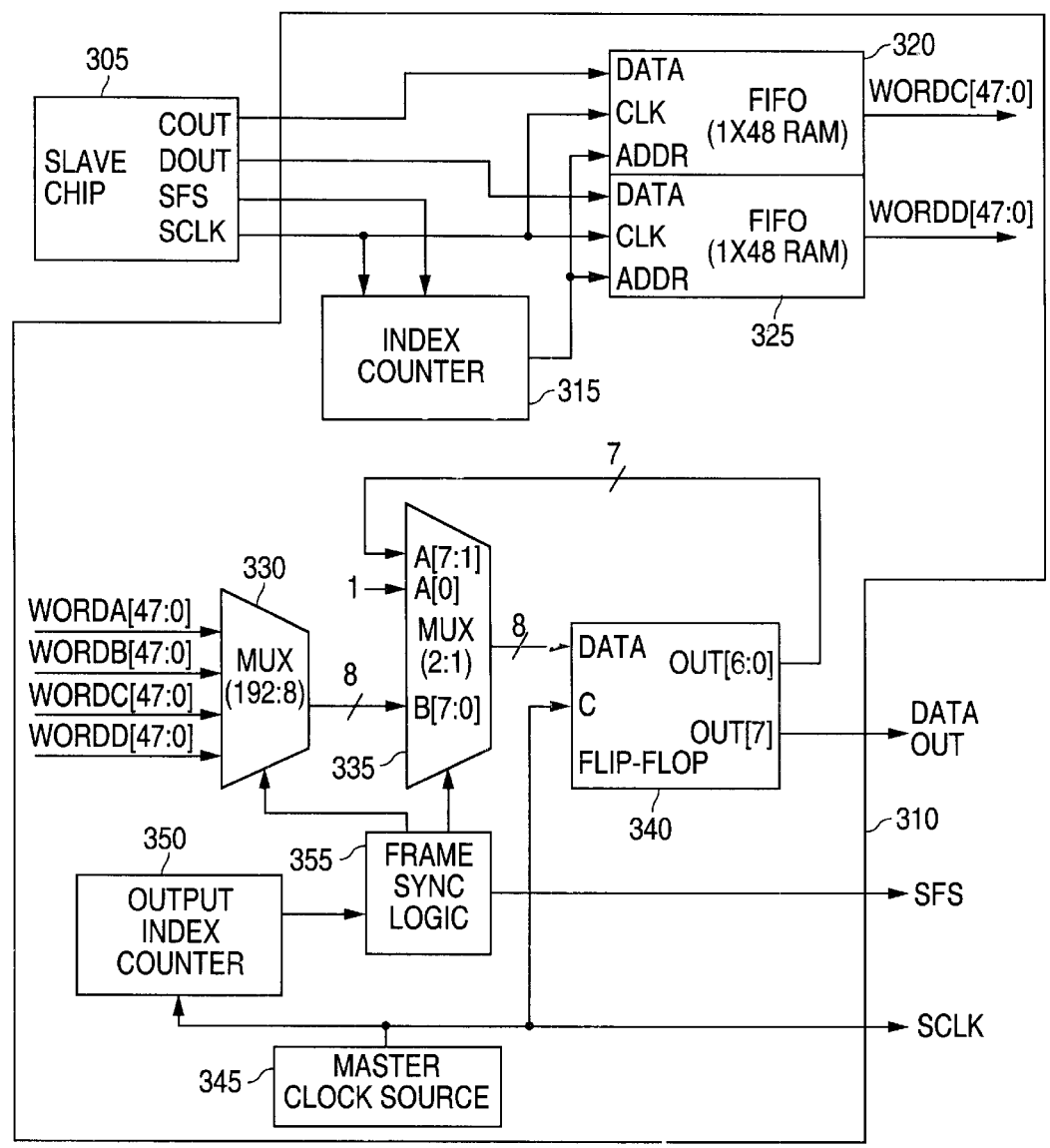
FIG. 3 illustrates an exemplary interface circuit for multiplexing multiple unsynchronized data streams from different clock domains according to one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged amplifier.

FIG. 1 illustrates selected portions of the receive signal path of exemplary radio frequency (RF) transceiver 100 according to one embodiment of the present invention. RF transceiver 100 may represent any conventional RF communication device, including a cell phone, a wireless network card, a two-way pager, and the like. The RF receive path through RF transceiver 100 comprises low-noise amplifier (LNA) 105, which receives an incoming RF signal from antenna 106. The RF receive path further comprises band pass filter (BPF) 110, RF amplifier 115, RF mixer 120, local oscillator (LO) 125, band pass filter (BPF) 110, intermediate frequency (IF) mixer 135, local oscillator (LO) 140, automatic gain control (AGC) circuit 145, and digital signal processor 150.

LNA 105 amplifies the incoming RF signal from antenna 106 to an intermediate level. BPF 110 filters the output of LNA 105 to remove noise outside of the desired receiver frequency range. RF amplifier 115 further amplifies the output of BPF 110 by a variable amount of gain determined by the gain control signal AGC1. RF mixer 115 down-converts the output of RF amplifier 115 by mixing it with the local oscillator reference signal from LO 125 to produce an intermediate frequency (IF) signal. RF mixer 115 effectively shifts the RF signal centered around the receiver RF operating frequency down to an intermediate frequency (IF) signal.

At this point, the signal output by RF mixer 115 may have spurious signals outside of the desired frequency range which have been amplified and/or introduced by the amplification steps. BPF 130 is an extremely narrow filter that blocks all but the desired frequencies of interest from reaching IF mixer 135. IF mixer 135 down-converts the IF output of BPF 130 by mixing it with is the local oscillator reference signal from LO 140 to produce a baseband signal. AGC circuit 145 further amplifies the output of IF mixer 145 by a variable amount of gain determined by the gain control signal AGC2.

Digital signal processor (DSP) 150 receives the baseband signal stream from AGC 145 and further processes the baseband signal stream according to the type of RF communication device in which RF transceiver 100 is implemented. In a typical implementation, DSP 150 receives multiple baseband signal streams. For example, if RF transceiver 100 performs quadrature phase shift keying (QPSK) demodulation, DSP 150 receives an in-phase (I) baseband signal and a quadrature (Q) baseband signal. Furthermore, RF transceiver 100 may be one of several RF transceivers implemented within the same RF communication device, such as the base station of a cellular telephone system or a wireless local area network (LAN) card. To reduce overall system expense, the multiple RF transceivers may share a common DSP to perform baseband processing. If the baseband data streams are packet based serial data streams, there is no guarantee that the input serial data streams to DSP 150 are synchronized or are derived from the same clock domain.

FIG. 2 illustrates selected portions of the transmit signal path of exemplary RF transceiver 100 according to one embodiment of the present invention. The transmit path comprises digital signal processor (DSP) 250, radio frequency (RF) modulator 205, local oscillator (LO) 210, RF amplifier 215, voltage-controlled attenuator (VCA) 220, and RF amplifier 225. DSP 250 receives multiple input signal streams from one or more baseband signal sources, such as a baseband in-phase (I) signal and a baseband quadrature (Q) signal from a baseband source and a quadrature source, respectively. As in the case of DSP 150, if the baseband data streams are packet based serial streams, there is no guarantee that the input serial streams to DSP 250 are synchronized or are derived from the same clock domain.

DSP 250 multiplexes together the input streams and outputs a combined baseband signal to RF modulator 205. RF modulator 205 mixes the combined baseband signal with a reference carrier signal received from LO 210 to produce an RF output signal. The RF output signal is then amplified by RF amplifier 215 to an intermediate level in the range of VCA 220. VCA attenuates the amplified RF output from RF amplifier 215 and the attenuated RF output of VCA 220 is amplified by RF amplifier 225 to a level suitable for transmission by antenna 106. The attenuation factor applied by VCA 220 is controlled by the value of the GAIN CONTROL signal.

FIG. 3 illustrates exemplary interface circuit for multiplexing multiple unsynchronized data streams from different clock domains according to one embodiment of the present invention. The interface circuitry multiplexes input serial data streams from the clock domain associated with slave chip 305 with input serial data streams from the clock domain associated with master chip 310. The input serial streams associated with master chip 310 are arbitrarily designated as the "master" serial data streams and the input serial data streams associated with slave chip 305 are designated as the "slave" serial data streams and are reclocked with the master data streams. According to exemplary embodiments of the present invention, master chip 310 may be a part of DSP 150 or DSP 250. Alternatively, master chip 310 may be part of an interface circuit that is external to DSP 150 or DSP 250.

Slave chip 305 produces two serial data streams, COUT and DOUT, that form two input serial data streams to master chip 310. The COUT and DOUT serial data streams are synchronous with each other and with a serial clock (SCLK) signal and a serial frame strobe (SFS) signal that also are output by slave chip 305. In the exemplary embodiment described below, the SOUT and DOUT serial data streams comprise 48-bit words that are clocked out of slave chip 305 at a rate of one bit per cycle of the SCLK signal. Each 48-bit word is delineated by a strobe of the SFS signal. Those skilled in the art will readily understand, however, that the selection of 48-bit words is by way of illustration only and that word sizes greater than or less than 48 bits may also be used in alternate embodiments of the present invention.

The 48-bit serial data streams, COUT and DOUT, are serially loaded into an input buffer stage in master chip 310 that makes each bit available as it is received. In the exemplary embodiment, the COUT signal is stored in first-in, first-out (FIFO) buffer 320 and the DOUT signal is stored in first-in, first-out (FIFO) buffer 325. In an exemplary embodiment of the present invention, buffers 320 and 325 may comprise 1×48 bit random access memory (RAM) devices. A first strobe of the SFS signal and a first clock cycle of the SCLK signal from slave chip 305 reset index counter 315 to an address of 0 (i.e., binary value=000000) and write the first bits of COUT and DOUT into buffers 320 and 325. Thereafter, the next 47 clock cycles of the SCLK signal increment the output address of index counter 315 from 0 to 47 (i.e., binary value=101111) and write the next 47 bits of COUT and DOUT into buffers 320 and 325.

Buffer 320 has a parallel output that forms the 48-bit word, WORDC[47:0]. As each bit of the COUT input serial data stream is written into buffer 320, that bit becomes available at the output, WORDC[47:0]. Similarly, buffer 325 has a parallel output that forms the 48-bit word, WORDD[47:0]. As each bit of the DOUT input serial data stream is written into buffer 325, that bit becomes available at the output, WORDD[47:0].

WORDC[47:0] and WORDD[47:0] are applied to the input channels of multiplexer (MUX) 330. Similarly, two other 48-bit words, WORDA[47:0] and WORDB[47:0] are applied to the input channels of MUX 330. WORDA[47:0] and WORDB[47:01] are generated from input serial data streams that come from serial data sources (not shown) located elsewhere in master chip 310 or from serial data sources (not shown) external to master chip 310. MUX 330 is a 192:8 multiplexer that has twenty-four (24) input channels, each of which is eight bits wide, and an output channel that is eight bits wide. The 8-bit output of MUX 330 is applied to one of the input channels, arbitrarily designated B[7:0], of multiplexer (MUX) 335.

Master chip 310 also comprises master clock source 345, output index counter 350, frame sync logic 355, and flip-flop (FF) 340. Master clock source 345 produces a master serial clock (SCLK) signal for master chip 310. The master SCLK signal clocks output index counter 350 and FF 340. For each 48 clock cycles of master clock source 345, output index counter 350 increments from 0 (000000) to 47 (101111) before resetting back to zero. The counter output of output index counter 350 is applied to frame sync logic 355, which generates a master serial frame strobe (SFS) signal once every 48 clock cycles. The master SFS signal delineates each 48-bit word in the serial data stream, DATA OUT, at the output of FF 340.

Frame sync logic 355 also generates channel select signals that are applied to MUX 330 and MUX 335. According to an exemplary embodiment of the present invention, frame sync logic 355 applies five channel select signals to MUX 330 that are operable to select one of the 24 input channels of MUX 330. Frame sync logic 355 also applies a channel select signal to MUX 335 that is operable to select either input channel A (i.e., A[7:1]) or input channel B (i.e., B[7:0]).

According to an advantageous embodiment of the present invention, frame sync logic 355 sequentially selects the 24 input channels of MUX 330 such that each of the 48-bit words applied to the input channels of MUX 330 are output to MUX 335 in 8-bit bytes from the most significant byte to the least significant byte. Thus, the first six channel select signals from frame sync logic 355 transfer the six bytes of WORDA[47:0] to MUX 335 in the following order: WORDA[47:40], WORDA[39:32], WORDA[31:24], WORDA[23:16], WORDA[15:8], and WORDA[7:0]. The second group of six channel select signals from frame sync logic 355 transfers the six bytes of WORDB[47:0] to MUX 335 in the following order: WORDB[47:40], WORDB[39:32], WORDB[31:24], WORDB[23:16], WORDB[15:8], and WORDB[7:0]. The third group of six channel select signals from frame sync logic 355 transfers the six bytes of WORDC[47:0] to MUX 335 in the following order: WORDC[47:40], WORDC[39:32], WORDC[31:24], WORDC[23:16], WORDC[15:8], and WORDC[7:0]. Finally, the fourth group of six channel select signals from frame sync logic 355 transfers the six bytes of WORDD [47:0] to MUX 335 in the following order: WORDD[47:40], WORDD[39:32], WORDD[31:24], WORDD[23:16], WORDD[15:8], and WORDD[7:0].

Each byte of WORDA[47:0], WORDB[47:0], WORDC [47:0], and WORDD[47:0] is output to MUX 335 for eight clock cycles of master clock source 345. During the first clock cycle, frame sync logic 355 also selects channel B of MUX 335, such that the byte applied at B[7:0] is transferred by MUX 335 to the 8-bit input of FF 340. At the end of the first clock cycle, FF 340 is strobed such that the selected 8-bit input is transferred to OUT[7:0] at the output of FF 340. The most significant bit, OUT[7], is coupled to the serial output, DATA OUT. OUT[6:0], the six least significant bits of the output of FF 340, are coupled to A[7:1], the seven most significant input bits of channel A, respectively, such that a hard wired left-shift operation is performed. A[0] is hard-wired to a Logic 1. Alternatively, A[0] may be hard-wired to a Logic 0.

At the end of the first clock cycle, frame sync logic 355 selects channel A of MUX 335 and continues to select channel A (i.e., A[7:0]) for the next seven clock cycles of the master SCLK signal. During each of the next seven clock cycles of the master SCLK signal, OUT[6:0] is left-shifted, applied to the DATA input of FF 340, and output to OUT [7:0]. Because of the left shift operation, each of the original OUT[6:0] is shifted out on OUT[7].

The net effect is that each of the six 8-bit bytes in WORDA[47:0] is selected by MUX 330 and MUX 335 and then is serialized by FF 340 and MUX 335. Thus, all forty-eight bits of WORDA[47:0] are serially shifted out at the master serial data output, DATA OUT. This process is then repeated for WORDB[47:0], WORDC[47:0], and WORDD[47:0].

Advantageously, since the master input serial data streams, WORDA[47:0] and WORDB[47:0], are output first, the slave input serial data streams, WORDC[47:0] and WORDD[47:0], may be stored in buffers 320 and 325 until needed. In multi-chip applications, the slave input serial data streams may be split into multiple streams and transferred at a slower rate to increase timing margins. Also, since buffers 320 and 325 are FIFO devices, master chip 310 may begin clocking out the beginning of the slave streams before slave chip 305 has completed transmission of COUT and DOUT to buffers 320 and 325. This provides a substantial amount of synchronization tolerance between master chip 310 and slave ship 305.

Although the present invention has been described in detail, those skilled in the art should understand that they can make various changes, substitutions and alterations herein without departing from the spirit and scope of the invention in its broadest form.

What is claimed is:

1. A serial stream interface for combining a master serial data stream comprising a sequence of N-bit master data packets and a slave serial data stream comprising a sequence of N-bit slave data packets, said serial stream interface comprising:
   a slave input interface comprising a slave buffer having a serial input for receiving said slave serial data stream and an N-bit slave parallel output for outputting each of said N-bit slave data packets, wherein said slave buffer stores said each N-bit slave data packet using at least one slave timing signal associated with said slave serial data stream;
   a source selection circuit having a first input channel capable of receiving an N-bit master parallel output from a first master data source and a second input channel coupled to said N-bit slave parallel output; and
   a serialization circuit having an input coupled to an output of said source selection circuit capable of receiving a selected one of said N-bit master parallel output and said N-bit slave parallel output and a serial output, wherein said serialization circuit sequentially shifts out each bit of said selected one of said N-bit master parallel output and said N-bit slave parallel output to produce an output serial data stream.

2. The serial stream interface as set forth in claim 1 wherein each bit in said each N-bit slave data packet stored in said slave buffer becomes available in said N-bit slave parallel output substantially concurrently with storage of said each bit in said slave buffer.

3. The serial stream interface as set forth in claim 2 wherein said slave buffer is a first-in, first-out (FIFO) device.

4. The serial stream interface as set forth in claim 3 wherein said slave buffer is a 1×N-bit random access memory (RAM).

5. The serial stream interface as set forth in claim 1 wherein said slave input interface further comprises a slave control circuit capable of receiving said at least one slave timing signal and generating therefrom at least one storage control signal capable of storing said each of said N-bit slave data packets in said slave buffer.

6. The serial stream interface as set forth in claim 1 wherein said source selection circuit comprises a first multiplexer having an M-bit output.

7. The serial stream interface as set forth in claim 6 wherein said serialization circuit comprises a second multiplexer having a first M-bit input channel coupled to said M-bit output of said first multiplexer.

8. The serial stream interface as set forth in claim 7 wherein said serialization circuit comprises a flip-flop circuit having an M-bit input coupled to an M-bit output of said second multiplexer, wherein said flip-flop latches M-bits of data received from said second multiplexer on an M-bit output of said flip-flop.

9. The serial stream interface as set forth in claim 8 wherein said second multiplexer further comprises a second M-bit input channel coupled to said M-bit output of said flip-flop.

10. A radio frequency (RF) receiver comprising:
    a receiver front-end circuit capable of receiving an incoming RF signal from an antenna and generating an amplified RF output signal;
    demodulation circuitry capable of demodulating said amplified RF output signal and generating a plurality of baseband serial data streams;
    a serial stream interface capable of receiving said plurality of baseband serial data streams and combining a master serial data stream comprising a sequence of N-bit master data packets and a slave serial data stream comprising a sequence of N-bit slave data packets, said serial stream interface comprising:
       a slave input interface comprising a slave buffer having a serial input for receiving said slave serial data stream and an N-bit slave parallel output for outputting each of said N-bit slave data packets, wherein said slave buffer stores said each N-bit slave data packet using at least one slave timing signal associated with said slave serial data stream;
       a source selection circuit having a first input channel capable of receiving an N-bit master parallel output from a first master data source and a second input channel coupled to said N-bit slave parallel output; and
       a serialization circuit having an input coupled to an output of said source selection circuit capable of receiving a selected one of said N-bit master parallel output and said N-bit slave parallel output and a serial output, wherein said serialization circuit sequentially shifts out each bit of said selected one of said N-bit master parallel output and said N-bit slave parallel output to produce an output serial data stream; and
    a digital signal processor capable of receiving and processing said output serial data stream.

11. The radio frequency receiver as set forth in claim 10 wherein each bit in said each N-bit slave data packet stored in said slave buffer becomes available in said N-bit slave parallel output substantially concurrently with storage of said each bit in said slave buffer.

12. The radio frequency receiver as set forth in claim 11 wherein said slave buffer is a first-in, first-out (FIFO) device.

13. The radio frequency receiver as set forth in claim 12 wherein said slave buffer is a 1×N-bit random access memory (RAM).

14. The radio frequency receiver as set forth in claim 10 wherein said slave input interface further comprises a slave control circuit capable of receiving said at least one slave timing signal and generating therefrom at least one storage control signal capable of storing said each of said N-bit slave data packets in said slave buffer.

15. The radio frequency receiver as set forth in claim 10 wherein said source selection circuit comprises a first multiplexer having an M-bit output.

16. The radio frequency receiver as set forth in claim 15 wherein said serialization circuit comprises a second multiplexer having a first M-bit input channel coupled to said M-bit output of said first multiplexer.

17. The radio frequency receiver as set forth in claim 16 wherein said serialization circuit comprises a flip-flop circuit having an M-bit input coupled to an M-bit output of said second multiplexer, wherein said flip-flop latches M-bits of data received from said second multiplexer on an M-bit output of said flip-flop.

18. The radio frequency receiver as set forth in claim 17 wherein said second multiplexer further comprises a second M-bit input channel coupled to said M-bit output of said flip-flop.

19. A radio frequency (RF) transmitter comprising:
    a serial stream interface capable of receiving a plurality of baseband serial data streams from a plurality of baseband data sources and combining a master serial data stream comprising a sequence of N-bit master data packets and a slave serial data stream comprising a sequence of N-bit slave data packets, said serial stream interface comprising:

a slave input interface comprising a slave buffer having a serial input for receiving said slave serial data stream and an N-bit slave parallel output for outputting each of said N-bit slave data packets, wherein said slave buffer stores said each N-bit slave data packet using at least one slave timing signal associated with said slave serial data stream;

a source selection circuit having a first input channel capable of receiving an N-bit master parallel output from a first master data source and a second input channel coupled to said N-bit slave parallel output; and a serialization circuit having an input coupled to an output of said source selection circuit capable of receiving a selected one of said N-bit master parallel output and said N-bit slave parallel output and a serial output, wherein said serialization circuit sequentially shifts out each bit of said selected one of said N-bit master parallel output and said N-bit slave parallel output to produce an output serial data stream;

a digital signal processor capable of receiving and processing said output serial data stream; and a RF modulation circuit capable of receiving a processed output data stream from said digital signal processor and upconverting said output processed data stream to produce a modulated RF signal.

20. The radio frequency transmitter as set forth in claim 19 wherein each bit in said each N-bit slave data packet stored in said slave buffer becomes available in said N-bit slave parallel output substantially concurrently with storage of said each bit in said slave buffer.

21. The radio frequency transmitter as set forth in claim 20 wherein said slave buffer is a first-in, first-out (FIFO) device.

22. The radio frequency transmitter as set forth in claim 21 wherein said slave buffer is a 1×N-bit random access memory (RAM).

23. The radio frequency transmitter as set forth in claim 19 wherein said slave input interface further comprises a slave control circuit capable of receiving said at least one slave timing signal and generating therefrom at least one storage control signal capable of storing said each of said N-bit slave data packets in said slave buffer.

24. The radio frequency transmitter as set forth in claim 19 wherein said source selection circuit comprises a first multiplexer having an M-bit output.

25. The radio frequency transmitter as set forth in claim 24 wherein said serialization circuit comprises a second multiplexer having a first M-bit input channel coupled to said M-bit output of said first multiplexer.

26. The radio frequency transmitter as set forth in claim 25 wherein said serialization circuit comprises a flip-flop circuit having an M-bit input coupled to an M-bit output of said second multiplexer, wherein said flip-flop latches M-bits of data received from said second multiplexer on an M-bit output of said flip-flop.

27. The radio frequency transmitter as set forth in claim 26 wherein said second multiplexer further comprises a second M-bit input channel coupled to said M-bit output of said flip-flop.

\* \* \* \* \*

UNITED STATES PATENT AND TRADEMARK OFFICE
CERTIFICATE OF CORRECTION

PATENT NO. : 6,670,899 B1
DATED : December 30, 2003
INVENTOR(S) : Jered M. Sandner It is certified that error appears in the above-identified patent and that said Letters Patent is hereby corrected as shown below:

Column 3,
Line 56, delete "is"; and

Column 5,
Line 29, delete "[47:01]" and insert -- [47:0] --.

Signed and Sealed this

Fifteenth Day of November, 2005

JON W. DUDAS
*Director of the United States Patent and Trademark Office*